United States Patent [19]
Howell

[11] Patent Number: 5,247,844
[45] Date of Patent: Sep. 28, 1993

[54] SEMICONDUCTOR PICK-AND-PLACE MACHINE CALIBRATION APPARATUS

[75] Inventor: David A. Howell, Boise, Id.

[73] Assignee: Micron Technology, Inc., Boise, Id.

[21] Appl. No.: 783,111

[22] Filed: Oct. 25, 1991

[51] Int. Cl.⁵ .............................................. H01L 21/66
[52] U.S. Cl. ...................................... 73/865.8; 437/8
[58] Field of Search ........................... 73/865.8; 437/8

[56] References Cited

U.S. PATENT DOCUMENTS

| | | | |
|---|---|---|---|
| 3,416,566 | 8/1969 | Gerstner | 437/8 X |
| 3,497,948 | 3/1970 | Wiesler et al. | 437/8 X |
| 3,715,242 | 2/1973 | Daniel | 437/8 X |
| 4,465,549 | 8/1984 | Ritzman | 437/225 X |
| 4,941,255 | 7/1990 | Bull | 156/235 X |

OTHER PUBLICATIONS

"Testing News", *Fuji News* (Sep. 1990), part 3, pp. 10-13.

*Primary Examiner*—Tom Noland
*Attorney, Agent, or Firm*—Hopkins, French, Crockett, Springer & Hoopes

[57] ABSTRACT

An apparatus and method of performing a calibration of the accuracy of placement of semiconductor chips or devices by a pick-and-place machine. The chips are placed on an adhesive-backed glass plate that has calibrated etch marks whose dimensions are chosen to aid the inspector in estimating, or carefully measuring in an optic comparator, the amount of placement error that the machine is causing. The calibration would be performed on a periodic basis as a preventive maintenance program.

7 Claims, 5 Drawing Sheets

SEMICONDUCTOR PICK-AND-PLACE MACHINE CALIBRATION APPARATUS

FIELD OF THE INVENTION

The invention relates to a semiconductor pick-and-place machine calibration method and apparatus having an etched glass plate, plate carrier, and an adhesive backing, such that device or chip placement can be visually inspected by viewing the etch marks relative to the device leads or pads.

BACKGROUND OF THE INVENTION

In a process of attaching multiple, tiny, discrete electrical devices or integrated circuit chips to a plastic circuit board (PCB), a pick-and-place machine can be used to pick up a part from a tray, rotate the part to a particular angular orientation, and then accurately place the part on a PCB. A typical machine placement accuracy should be about 0.006 inches (6 mils).

The consequence of inaccurate placement on the PCB is that a misalignment of the device lead over a solder bonding area can result in poor or lack of electrical contact between the device lead and the PCB conductor. The bonding is accomplished by inserting the loaded PCB in a furnace to melt the solder paste. A typical printed circuit assembly (PCA) can consist of numerous types of components attached to a PCB.

If the pick-and-place machine has a consistent or periodic error, there can be catastrophic results in manufacturing these PCA's. A typical pick-and-place machine can have one or more, i.e. 12, rotating heads with vacuum connections for picking. The rotation of the head places devices typically at 0°, 90°, 180°, and 270° on the PCB to match PCB connections. It is important that the placement be accurate in the X-plane, Y-plane, and angular orientation.

A glass board and glass part device is currently available from Fuji Electric Company that can be used to check pick-and-place machine accuracy in placement of a "glass" quad flat pack (QFP).

There are marks on the glass that differ in distance (i.e., 0.005") between marks compared to the leads of the QFP device. Thus, a misplaced device can be located by noting which of the marks line up with a corresponding lead.

This device has limited use in that it is not using the actual part but a glass part that simulates the QFP device. It, therefore, does not include the inherent dimensional differences within the device tolerances.

It is, therefore, the purpose of this invention to provide a unique, simple, accurate method and apparatus that, by inspection, can determine proper micro chip placement on a PCB.

SUMMARY OF THE INVENTION

This invention discloses an apparatus that measures a micro chip or discrete component placement accuracy. In general terms, it comprises an etched glass plate having etched calibration marks on a top surface. The glass plate is inserted into a supporting plate carrier having an alignment means, such as a pair of alignment pins that mate with a pair of apertures in the glass plate. An adhesive means, such as transparent double-backed adhesive tape, is placed over the top glass surface, and the glass plate and carrier are placed in a pick-and-place machine.

The pick-and-place machine, such as a Fuji FIP II, FCP III, or Quad 2000, then places devices or chips (based on a pre-programmed location) on the glass plate adhesive which retains the chip. Inspection of the chip lead location relative to rectangular pad marks and other calibration lines is accomplished by inverting the glass and visually inspecting or placing in an optical comparator or digitizer to accurately measure possible misalignment of chip leads relative to the marks.

The procedure consists of the following steps:
affixing a glass plate over a plate carrier, the plate having etched calibration marks;
affixing a transparent adhesive means over the glass plate;
preparing a program for the pick-and-place machine;
loading a plurality of chips into the pick-and-place machine;
inserting the glass plate and plate carrier in the machine;
running the program, which then places the plurality of chips on the adhesive means;
removing the glass plate from the carrier; and then
inverting and inspecting the glass plate to determine proper placement of chips by observing chip placement relative to the etched calibration marks.

Other objects, advantages, and capabilities of the present invention will become more apparent as the description proceeds.

DETAILED DESCRIPTION OF THE INVENTION

Figure 1:
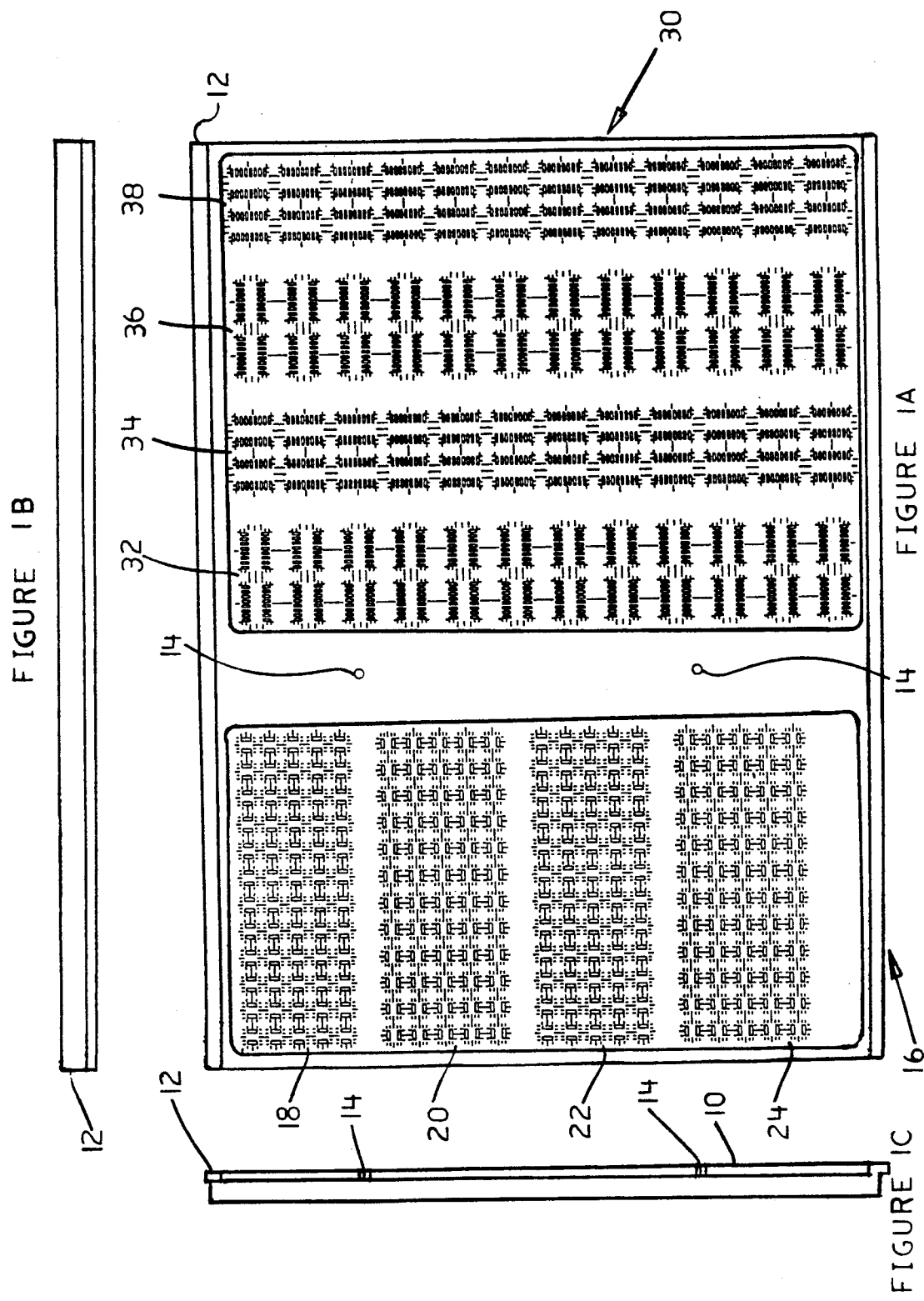
FIG. 1A is a top view of a semiconductor inspection and calibration glass plate and plate holder of the present invention.
FIG. 1B is a side elevation of the plate holder.
FIG. 1C is an end view of the glass and plate holder.

Referring to FIGS. 1A, 1B, and 1C, a calibrated glass plate 10 is illustrated mounted on a metal plate carrier 12. Glass plate 10 in this application is shown aligned in carrier 12 by two alignment pins 14. This plate has been etched to provide calibration marks on a first section 16 for an array of 240 capacitors (not shown). A first array 18 is oriented at 0°; a second capacitor array 20 is oriented at 90° rotation from the first; and third and fourth arrays 22, 24 are oriented at 180° and 270° from the first array.

These etched marks match the arrangements and orientation of capacitors and SOICs that are normally mounted on a PCB board, as placed by a chip pick-and-place machine. This particular plate has etched rectangular boxes indicating the capacitor or SOIC proper lead locations. There are also calibration marks adjacent the boxes to aid in determining actual dimensional variations of individual chips. These marks indicate skewed or misoriented positions of a chip as a result of misplacement or an out-of-calibration condition of the chip pick-and-place machine.

Figure 2:
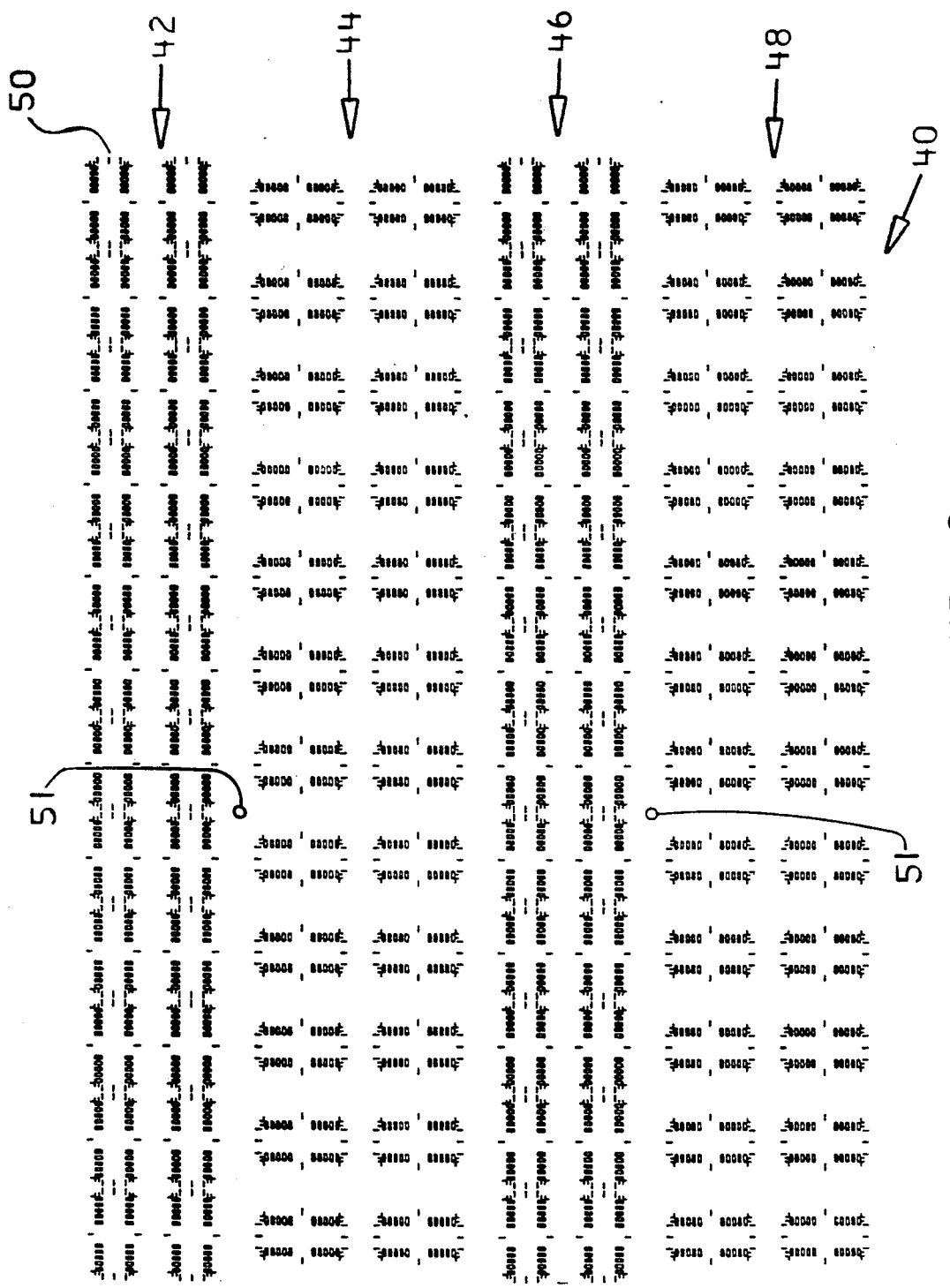
FIG. 2 is a top view of the glass plate for attachment of small outline J (SOJ) chips.

Referring to FIG. 2, a calibrated glass plate for a 96 chip SOJ-20 is illustrated at 40. In this case, there are 20 rectangles for matching 20 leads on the chip as opposed to the 16 rectangles of FIG. 1 to match the SOIC-16 chips. Similar to FIG. 1, FIG. 2 illustrates the chip rectangle orientation marks at 0°, 90°, 180°, and 270° as at arrows 42, 44, 46, and 48. This figure also indicates the etched calibration marks at 50 and alignment pin apertures 51.

Figure 3:
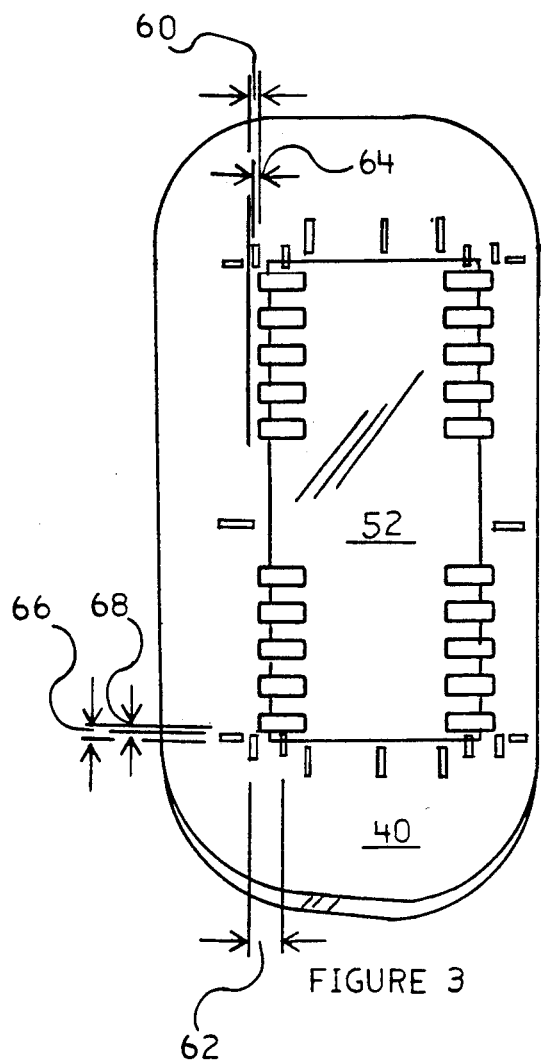
FIG. 3 is a bottom view of the glass plate having a properly aligned SOJ chip attached thereto.
Figure 5:
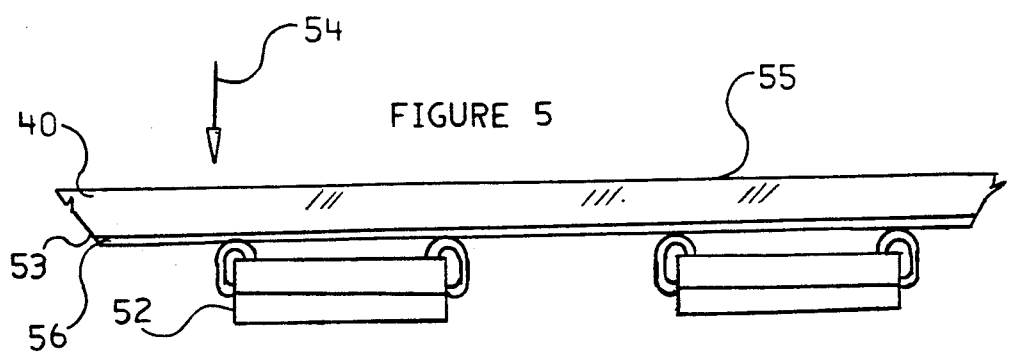
FIG. 5 is an enlarged side section view of the glass plate and attached chip.

Referring now to FIGS. 3 and 5, an SOJ-20 chip 52 is shown properly positioned on a top surface 52 of a calibration plate 40. In these figures, the glass plate 40, with the attached SOJ-20 chip 52 has been inverted so as to be observed and inspected from direction of arrow 54 through the bottom surface 55. The chip has been placed on the glass 40 by a pick-and-place machine and affixed by a transparent adhesive means 56, such as a clear double-backed tape.

The dimensions in FIG. 3 are as follows: pad edge to centerline mark 60 is 0.016"; distance between short marks 62 is 0.0325"; pad edge to left edge of short mark 64 is 0.008"; pad edge to bottom edge of horizontal mark 66 is 0.010"; and the pad edge to top edge of horizontal mark 68 is 0.005". These mark dimensions are chosen based on a percentage of the tolerances for misplacement of the SOJ-20 chip on the PCB.

Figure 4:
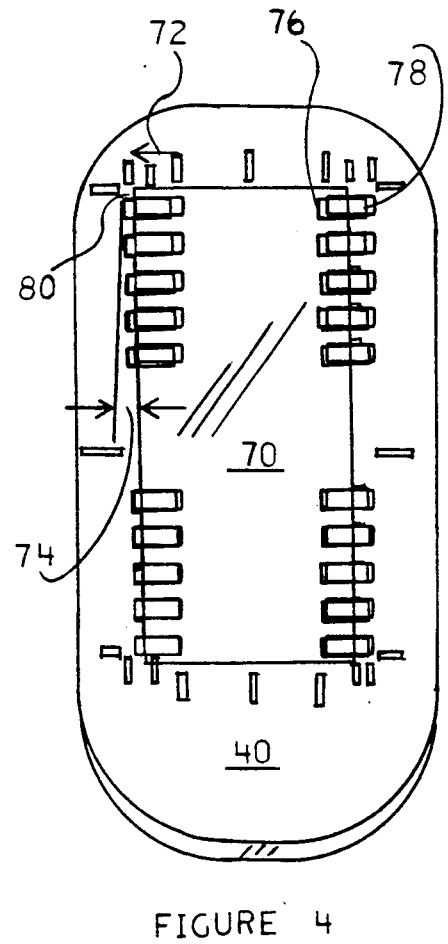
FIG. 4 is an enlarged bottom view of the glass plate having an improperly aligned SOJ chip attached thereto.

Referring to FIG. 4, a misoriented SOJ-20 chip 70 is shown attached to glass 40 by adhesive 56. The misorientation that has occurred is a rotation of chip 70 in the direction of arrow 72 causing a misalignment as indicated by small angle $\phi$ as at 74. An approximate measure of the angle $\phi$ at 74 indicates an azimuth error of about 2°. A typical pick machine specification for azimuth error is about $\pm\frac{1}{2}°$. Actual errors can be accurately measured using an optical comparator, sometimes called a digitizer in the art. This comparator projects a 10× image on a screen and provides digital readout for the X- and Y-planes. The misalignment can be seen by displacement of chip lead 76, which is not aligned with glass etch mark rectangle 78. This misalignment can be estimated as about 0.01" based on the two perpendicular etch marks at 80 which, as shown at 60, are 0.01" on FIG. 3. This can also be estimated based on one-half of dimension 62, which is 0.0325" as noted at mark location 78.

This value 0.016", although exaggerated, is 0.010" outside of a typical pick-and-place machine specification of ±0.006". It is, therefore, noted by the operator that the pick-and-place machine has at least one pick-and-place vacuum nozzle orientation problem requiring correction.

Typical dimensions for an SOIC-16 and capacitor measurements are indicated on enlarged plan views of FIGS. 6 and 7 and FIGS. 8 and 9, respectively.

Figure 6:
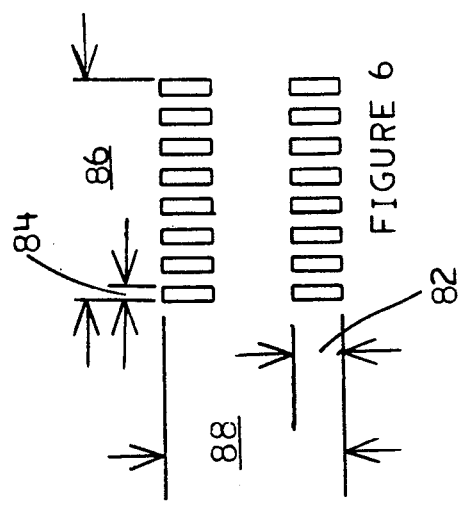
FIG. 6 is an enlarged plan view of an SOIC-16 etched glass plate.

The SOIC-16 etch glass pad dimensions of FIG. 6 are as follows: pad length 82 is 0.085"; pad width 84 is 0.025"; pad total footprint length 86 is 0.375"; and total pad footprint width 88 is 0.305".

Figure 7:
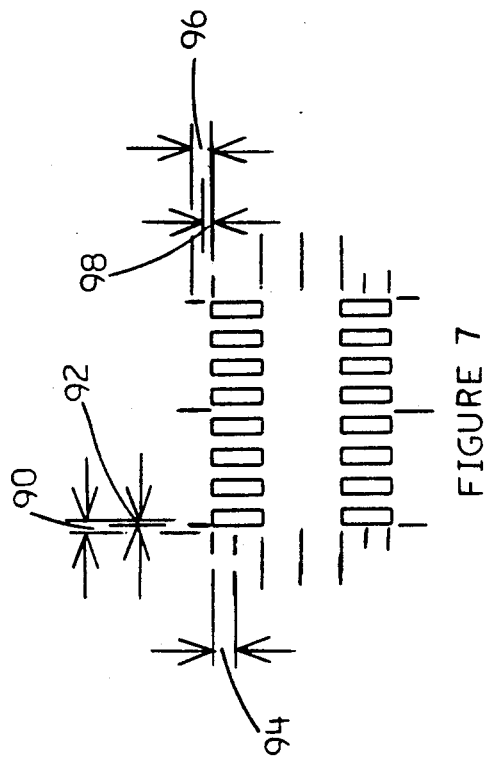
FIG. 7 is an enlarged plan view of an SOIC-16 etched glass plate having calibration marks.

The typical SOIC-16 calibration mark dimensions of FIG. 7 are as follows: pad edge to left edge of vertical mark 90 is 0.0095"; pad edge to right edge of mark 92 is 0.004"; distance between horizontal mark 94 is 0.0425"; and distances from pad top edge to centerline mark 96 and top edge to top of horizontal mark 98 are 0.0075".

Figure 8:
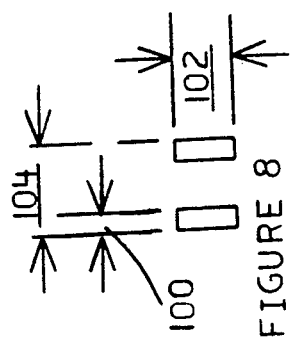
FIG. 8 is an enlarged plan view of a capacitor etched plate.

The pad dimension marks of the capacitor are shown in FIG. 8 as follows: pad width 100 is 0.020"; pad length 102 is 0.100"; and total length of pad footprint 104 is 0.134".

Figure 9:
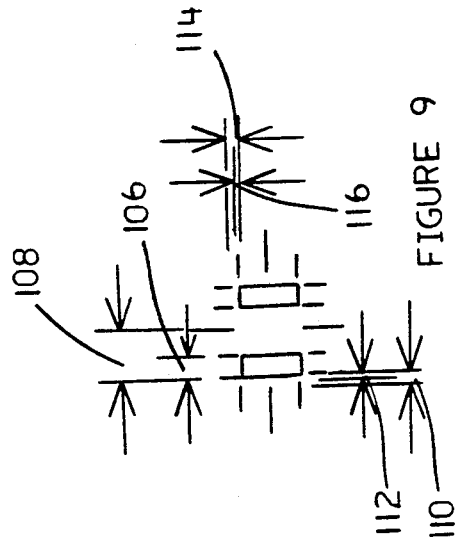
FIG. 9 is an enlarged plan view of a capacitor etched plate.

The calibration marks for the Micron Technology No. 1210 capacitor are dimensioned in FIG. 9 as follows: the top vertical distance between short marks 106 is 0.0375"; top short mark to center mark 108 is 0.075"; pad edge to bottom short mark 110 is 0.015"; pad edge to bottom long mark 112 is 0.006"; pad top edge to short mark 114 is 0.0225"; and top edge to center mark 116 is 0.0125".

Figure 10:
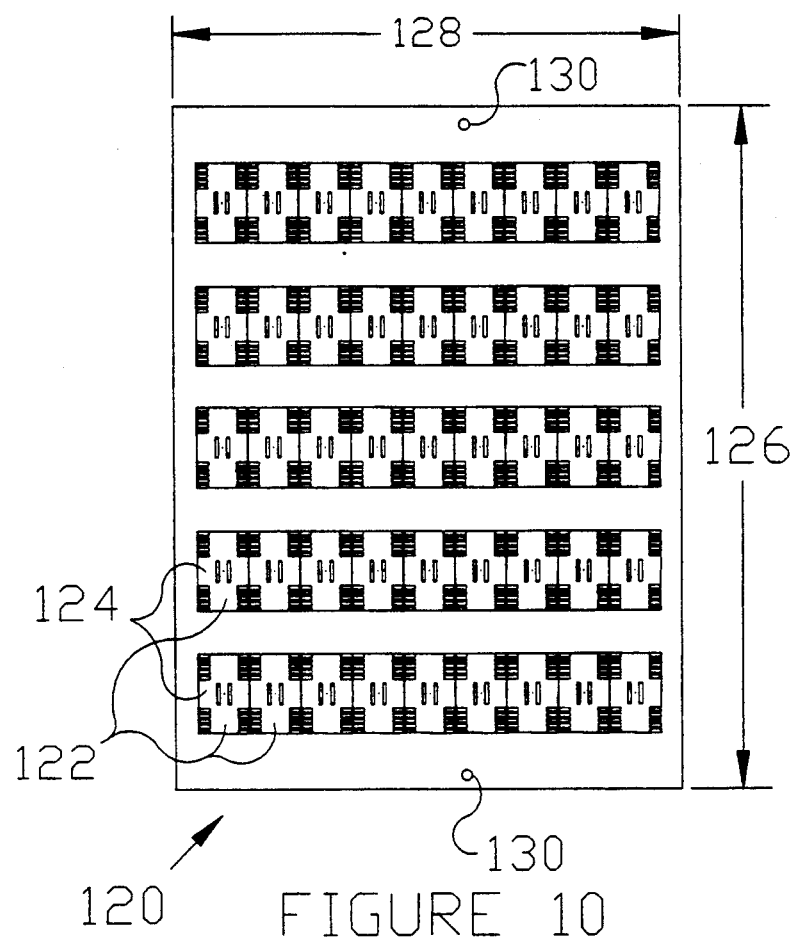
FIG. 10 is a plan view of a glass plate etched for capacitors and SOJ-20 chips.

FIG. 10 illustrates a specific calibration plate 120 for a Micron Technology No. 0720 9× module. This plate indicates the locations of 45 SOJ-20 chip pad marks 122 which are placed above 45 capacitor marks as at 124. The dimension of the glass plate, which matches the PCB are length 126 of 5.100" and a width 128 of 3.350". The calibration pad marks for each device would be similar to FIGS. 6 and 9. In this glass plate, only the pad rectangles have been etched on the glass due to the proximity of the devices, i.e., there is only 0.004" between adjacent SOJ-20 chip leads. Alignment pin apertures appear at 130.

EXAMPLES

Two examples are given below. In the first example, a first pick-and-place machine was tested for placement accuracy and was determined to be out of control, i.e., a high error rate in chip placement.

The basic quality control data needed is a measure of an X-coordinate, a Y-coordinate, and a rotational angular value for placement of a chip on a PCB by the pick-and-place machine. The "process potential index", or "capabilities index" $C_p$ is calculated as follows:

$$C_p = \frac{USL - LSL}{6\sigma}$$

$$\text{and } C_{pl} = \frac{X - LSL}{3\sigma}$$

$$C_{pu} = \frac{USL - X}{3\sigma}$$

where USL is an upper specification limit; LSL is a lower specification limit; $\sigma$ is the standard deviation as measured on a plurality of device placements; and $\overline{X}$ is the mean of the data population.

A "capability ratio" $C_R$ is the reciprocal of $C_p$. It is desirable to have $C_R$ values of 0.75 or less. In that case, a value of 0.75 indicates that the process is using 75% of the specification width. If $C_R$ equals 0.75, $C_p$ is 1.33.

In the case of a skewed curve instead of a normal curve, $C_{pk}$ is determined to be the lesser of $C_{pu}$ or $C_{pl}$. If $C_{pk}$ is larger than one, the $6\sigma$ spread is entirely within the specification spread. If the $C_{pk}$ is between 0 and 1 part of the $6\sigma$ spread falls outside of the specifications. If the $C_{pk}$ is negative the process mean falls outside of the specification limits. $C_{pk}$ is equal to $C_p$ when the process mean is centered on the specification nominal.

The ideal $C_{pk}$ should be 1.33 or larger, which indicates that the process is using up 75% of the specification width or less.

In the second test on a second machine, the data indicates that an accurate placement of chips can be expected.

EXAMPLE I

Forty-five SOJ-20's were placed on a glass plate 120 in a 0720 pattern as shown in FIG. 10 and measurements were obtained using the Fuji digitizer. $C_p$ values were calculated for the X, Y, and Theta (angular) axes and are as follows:

$$C_p = \frac{USL - LSL}{6\sigma}$$

$$C_p(X) = 0.675 \text{ and } C_R = \frac{1}{C_p} = 1.48$$

Xbar = 0.006911
Sigma = 0.002716
USL = 0.0055
LSL = −0.0055

The USL and LSL are calculated by determining the worst case scenario of misplacement in the X directions for two adjacent components while still leaving the minimum 0.004″ between the component leads (based on an average package width of 0.335″ and 0720 X-pitch of 0.350″).

$C_p(Y)$ = 0.654 and $C_R$ = 1.52
Xbar = 0.007978
Sigma = 0.006117
USL = 0.012″
LSL = −0.012″

The USL and LSL are calculated by determining the maximum amount of Y axis misplacement to create at 50% off the pad situation (0.020″ leads on a 0.0025″ pad).

$C_p(Theta)$ = 0.214 and $C_R$ = 4.67
Xbar = 89.824404
Sigma = 0.791515
USL = 0.5083°
LSL = 0.5083°

The USL and LSL are calculated by determining the worst case scenario of skew in the theta axis for two adjacent components while still leaving the minimum 0.004″ between the component leads (based on an average package width of 0.335″ and 0720 X-pitch of 0.350″).

The least capable axis, Theta, dictates the overall capability of the machine. Therefore, the $C_p$ of this assembler is 0.214, definitely not an adequate value, being less than the desired 1.33.

The parts assembled by this machine were then checked and measured for placement error, and it was determined there was a direct correlation between parts erroneously placed when using this particular machine.

EXAMPLE II

A second pick-and-place machine by a different manufacturer was tested using dummy SOJ-20's on a plate marked similar to FIG. 3. There were four separate plates having a combined total of 377 chip placements. Data was collected for the X and Y planes only. Calculations indicate the following values using a machine placement specification of ±0.006″.

$C_R(X)$ = 0.265
$C_{pk}(X)$ = 3.67
$C_R(X)$ = 0.33
$C_{pk}(Y)$ = 2.95

In this example, the value of $C_{pk}$, being greater than 1.33 indicates an accurate placement machine.

While the present process and equipment is described as a manual visual or optical comparator inspection, it is conceived that the process and apparatus could be incorporated within the existing state-of-the-art pick-and-place machines, so as to provide a constant automatic self-monitoring system.

Although the description and drawings describe the chips as being SOJ's, SOIC's, and capacitors, there are many other devices that can be placed by the pick-and-place machines where this inspection apparatus can be used.

Some examples are: plastic leaded chip carriers (PLCC), very small outline package (VSOP), quad flat pack (QFP), and many discrete devices, such as resistors, coils, transistors, diodes, light-emitting diodes (LEDs), filters, and switches.

While a preferred embodiment of the invention has been disclosed, various modes of carrying out the principles disclosed herein are contemplated as being within the scope of the following claims. Therefore, it is understood that the scope of the invention is not to be limited except as otherwise set forth in the claims.

What is claimed is:

1. In a semiconductor chip manufacturing process, an apparatus that measures chip placement accuracy comprising:
   a. an etched glass plate having a top and bottom surface, the top surface having etched calibration marks;
   b. a plate carrier supporting the glass plate bottom surface and having plate alignment means further comprising a pair of pins on a top surface of the plate carrier that engages a pair of apertures in the glass plate; and
   c. an adhesive means on the glass plate top surface, wherein placement accuracy of a plurality of integrated circuit chips and passive components on the adhesive means can be determined by inverting the glass plate and performing an inspection of the location of a chip lead relative to the calibration marks.

2. In a semiconductor chip manufacturing process, an apparatus that measures chip placement accuracy comprising:
   a. an etched glass plate having a top and bottom surface, the top surface having etched calibration marks;
   b. a plate carrier supporting the glass plate bottom surface and having plate alignment pins; and
   c. a double-backed adhesive tape on the glass plate top surface, wherein placement accuracy of a plurality of integrated circuit chips and passive components on the adhesive tape can be determined by inverting the glass plate and performing an inspection of the location of a chip lead relative to the calibration marks.

3. The apparatus of claim 2 and wherein:
   the etched calibration marks comprise a plurality of rectangles.

4. The apparatus of claim 3 and wherein:
   a plurality of calibrated line marks adjacent the rectangles, indicate a measure of misalignment of the chip.

5. The apparatus of claim 4 and wherein:
a first section of the glass plate is marked to indicate lead location for a plurality of capacitors and an adjacent section is etched to indicate a lead location for a plurality of SOIC's.

6. The apparatus of claim 3 and wherein:
the etched glass late is marked to indicate a lead location for a chip selected from the group consisting of: SOJ, SOIC, PLCC, VSOP, and QFP.

7. The apparatus of claim 3 and wherein:
the etched glass plate is marked to indicate a lead location for a discrete device selected from the group consisting of capacitors, resistors, coils, transistors, diodes, LED's, filers, and switches.

* * * * *